(12) United States Patent
Regev et al.

(10) Patent No.: US 6,785,153 B2
(45) Date of Patent: Aug. 31, 2004

(54) TERTIARY CAM CELL

(75) Inventors: Zvi Regev, West Hills, CA (US); Alon Regev, Woodland Hills, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/684,388

(22) Filed: Oct. 15, 2003

(65) Prior Publication Data

US 2004/0081000 A1 Apr. 29, 2004

Related U.S. Application Data

(62) Division of application No. 10/202,003, filed on Jul. 25, 2002.
(60) Provisional application No. 60/324,462, filed on Sep. 25, 2001.

(51) Int. Cl.[7] ............................................... G11C 15/00
(52) U.S. Cl. ......................... 365/49; 365/149; 365/204
(58) Field of Search .......................... 365/49, 149, 204

(56) References Cited

U.S. PATENT DOCUMENTS

| | | | |
|---|---|---|---|
| 4,622,653 A | | 11/1986 | McElroy |
| 5,642,320 A | | 6/1997 | Jang |
| 5,642,322 A | | 6/1997 | Yoneda |
| 5,999,435 A | | 12/1999 | Henderson et al. |
| 6,266,262 B1 | * | 7/2001 | Washburn et al. ............ 365/49 |
| 6,331,961 B1 | | 12/2001 | Kengeri et al. |
| 6,580,628 B2 | * | 6/2003 | Barnes ........................ 365/49 |
| 6,647,457 B1 | * | 11/2003 | Sywyk et al. ............... 711/108 |
| 6,711,041 B2 | * | 3/2004 | Pereira et al. ................ 365/49 |

FOREIGN PATENT DOCUMENTS

JP   56029891   3/1981

OTHER PUBLICATIONS

Muhammad M. Khellah, Mohamed I. Elmasry, "Low–Power Design of High–Capacitive CMOS Circuits Using a New Charge Sharing Scheme", 1999 IEEE International Solid State Circuits Conference.

Bruce Jacob, "Cache Design for Embedded Real–Time Systems", Embedded Systems Conference, Jun. 30, 1999.

"Implementing High–Speed Search Applications with APEX CAM", Altera Corporation, Application Note 119, Jul. 1999, ver. 1.01.

* cited by examiner

*Primary Examiner*—Richard Elms
*Assistant Examiner*—Tuan T. Nguyen
(74) *Attorney, Agent, or Firm*—Dickstein Shapiro Morin & Oshinsky LLP

(57) ABSTRACT

A tertiary CAM cell with three bits of storage, the three bits of storage are arranged to support three stable states which can be read from the CAM cell without requiring a charge restoration operation. The three stables states are those states where one of the three bits is at a first logical state while the remaining two bits are at a second logical state. The three stables states may be used to encode the three logical states used in a ternary CAM.

7 Claims, 8 Drawing Sheets

US 6,785,153 B2

TERTIARY CAM CELL

This application is a divisional of Application Ser. No. 10/202,003, filed Jul. 25, 2002, which, in turn, claims the benefit of U.S. Provisional Application Serial No. 60/324,462 filed Sep. 25, 2001. Each of these applications are incorporated herein by reference.

FIELD OF INVENTION

The present invention relates generally to semiconductor memory, and more particularly to a tertiary CAM cell.

BACKGROUND OF THE INVENTION

Many applications require searching information at high speed. In many network devices, such as switches or routers, data packets are transferred based on the contents of embedded address information. Thus, in order to achieve a high data transfer rate, network systems must be able to perform very high speed searches and comparisons. One class of circuits useful for this function is a content addressable memory or CAM. It should be noted that although the following discussion is set within the context of a networked system, there are many other applications which require high speed searching and comparison, and which may also therefore benefit from the present invention. For example, the tag field of a fully associative cache memory also requires high speed searching and may be implemented using a CAM.

It may be useful to compare a CAM against a traditional memory device, such as a random access memory (RAM). To an extent, CAM and RAM device operate conversely. For example, a RAM may be read by presenting it with a read command and an address. The RAM responds by outputting the data stored at the specified address. However, when a CAM is read, it is presented with a data sample, and the CAM returns an match signal indicating whether the data sample is stored in the CAM, and if so, an address within the CAM which contains the data which matched the sample.

Network routers and switches generally employ a matching function, where a portion of a packet, such as an address field, is compared to a list of data entries. The list is often referred to as a database. FIG. 1 is a block diagram of an exemplary CAM device 100, which includes a CAM array 110 for storing the database, a match detection circuit 120 for detecting matches, and optionally a priority encoder 130 for selecting and outputting a matching address in a priority order, when appropriate. The CAM device also includes a controller 140, for controlling the operation of the CAM array 110, match detection logic 120, and priority encoder 130, as well as for interfacing the CAM device 100 to other devices via the data 150a, address 150b, and control 150c lines. Commercially available CAM devices may support, for example, searching a 136-bit wide data sample against a database having up to 16,384 entries. Commercially available CAM devices may be searched at rates up to 100 million searches per second. This ability for CAMs to quickly search relatively wide data words against relatively large databases at high speeds makes them highly useful in applications such as network routing and switching.

There are two types of searches which are of interest, namely a search for the exact match and the partial match search. In the exact match search, an entry stored in the CAM will match the data sample only if the data sample and the entry match bit for bit. In a partial match search, the search may be conducted on only a subset of bits in the word. That is, the CAM entries are permitted to specify a third "don't care" state in addition to the logical "0" and "1" states. When a partial match search is conducted, CAM entries will match a data sample as long as each bit in the entry set at a logical "0" or "1" states match the corresponding portion of the data sample.

CAMs having entries which only support the logical "0" and logical "1" states are known as binary CAMs, and can only support exact match searches. CAMs having entries which also support the use of the "don't care" state are known as ternary CAMs, and can be used for partial match searches. (These CAMs also support exact match searches when an entry does not contain any "don't care" states.)

In a ternary CAM, each bit of the database stored in the CAM array 110 must be represented by at least two bits, in order to encode the three required logical states ("0", "1", and "don't care"). Although a number of different technologies can be used to construct the CAM array 110, modern CAM devices use storage elements based upon a static random access memory (SRAM), where data is stored in a flip-flop, or a dynamic random access memory (DRAM), where data is stored in the form of a charge on a capacitor. FIG. 2 is an illustration of a CAM cell 200 based upon DRAM technology.

The cell 200 includes a transistor 202 and a capacitor 203, which are coupled in series between a bit line 201 and a ground potential 206 as illustrated in FIG. 2. A select line 205 is coupled to the gate of the transistor 202. Additionally, the cell 200 inherently includes parasitic capacitance, which is illustrated in FIG. 2 as capacitor 204, coupled between the bit line 201 and ground 206. Data may be stored in the cell 200 by switching transistor 202 on (via line 205) and forcing bit line 201 to either a high or a low state. This causes the capacitor 203 to charge or discharge until the potential at node 207 equals the potential of the bit line. The transistor 202 is then switched off (via line 205) and the potential at node 207 is maintained by the charge stored in capacitor 203.

In order to read data stored in the cell 200, the bit line 201 is precharged to a high level. This ensures that the parasitic capacitance 204 is also charged. The transistor 202 is then switched on (via line 205). If the capacitor 203 is storing a charge so that the potential at node 207 is high, there is no change of potential at node 207 and at the bit line 201. The charge level of the capacitor 203 is also unchanged. However, if the capacitor 203 is storing a charge so that the potential at node 207 is low, charge will flow from the bit line 201 through the transistor 202 and into the capacitor 203. This causes the potential at the bit line 201 to decrease and the potential at node 207 to increase. The charge level of the capacitor 203 also increases. The change in voltage in the bit line 201 and/or at node 207 can be sensed, in order to determine logical stated stored in the capacitor 202.

The CAM cell illustrated in FIG. 2 stores a single bit of data, and is therefore capable of encoding only two states. As previously discussed, ternary CAMs require cells which can encode three states. The 300 circuit illustrated in FIG. 3 is similar to that the circuit 200 illustrated in FIG. 2, but includes two storage elements. This permits the cell 300 to store two bits, which can encode four states, three of which is sufficient to serve the storage requirements of a ternary CAM cell.

One problem associated with dynamic CAM cells 200, 300 is that a read operation may be destructive. In cell 200, for example, when the read operation is performed on a cell in which the capacitor 202 is storing a low level of charge, the flow of charge from the bit line 201 during the read operation alters the charge level of the capacitor 202. Thus, in CAM cells 200, 300, a charge restoration operation is required after each read operation. The requirement for performing a charge restoration operation after each read limits the speed of a CAM device. The charge restoration circuit (not illustrated) also requires additional components and increases power consumption.

FIG. 4 is an illustration of another CAM cell 400. In comparison to the previously described CAM cell 300 (FIG. 3), CAM cell 400 includes two additional transistors 402a, 402b, which are coupled in parallel with the data storage capacitors 203a, 203b, respectively. The gate of transistor 402a is coupled to node 207b while the gate of transistor 402b is coupled to node 207a. These two transistors 402a, 402b provide the circuit 400 a limited form of protection from destructive reads. More specifically, the CAM cell 400 can be read nondestructively only if the capacitors 203a, 203b store opposite charges (i.e., "0"+"1" or "1"+"0"). Thus if the CAM cell 400 were used with control circuitry (e.g., controller 140 (FIG. 1)) which only permits storing in CAM cell 400 the two opposite charge states, the CAM cell 400 can be used as a dynamic binary CAM cell not requiring charge restoration after a read. Unfortunately, the CAM cell 400 is unsuitable for use a ternary CAM cell because ternary CAM cells must be able to store at least three states. Accordingly, there is a need and desire for a method and apparatus for an efficient dynamic CAM cell architecture which does not require charge restoration after each read operation.

SUMMARY OF THE INVENTION

The present invention is directed to a ternary CAM cell which stores charge in a manner similar to a DRAM cell, but which also can be nondestructively read. That is, a read operation does not have to be followed by a charge restoration operation in order to maintain data integrity. The three required states of a ternary CAM (logical "0", logical "1", and "don't care") may be stored using three bits of storage. The use of three bits of storage per CAM cell permits the use of a circuit topology which include three states which can be read nondestructively.

BRIEF DESCRIPTION OF THE DRAWINGS

The foregoing and other advantages and features of the invention will become more apparent from the detailed description of exemplary embodiments of the invention given below with reference to the accompanying drawings in which.

DETAILED DESCRIPTION OF THE INVENTION

Figure 1:
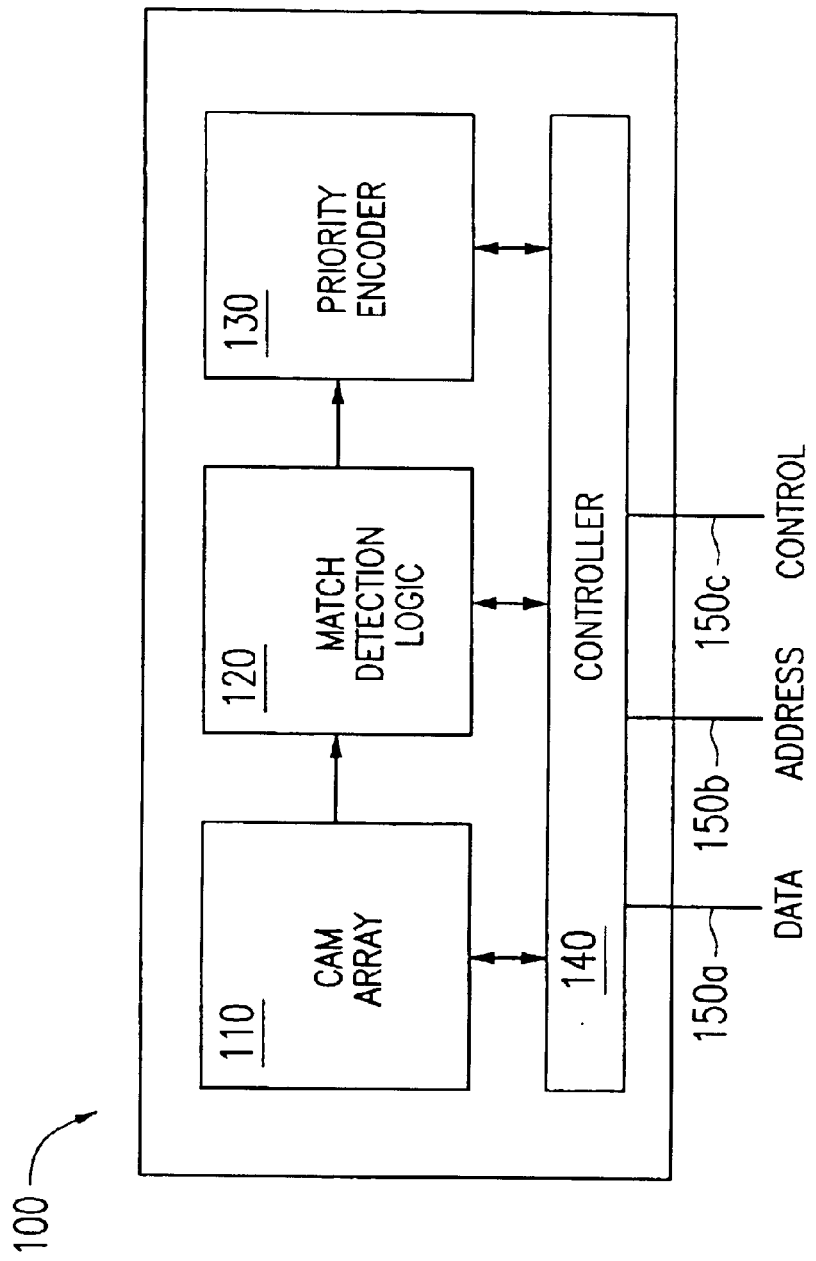
FIG. 1 is a block diagram of a content addressable memory.
Figure 2:
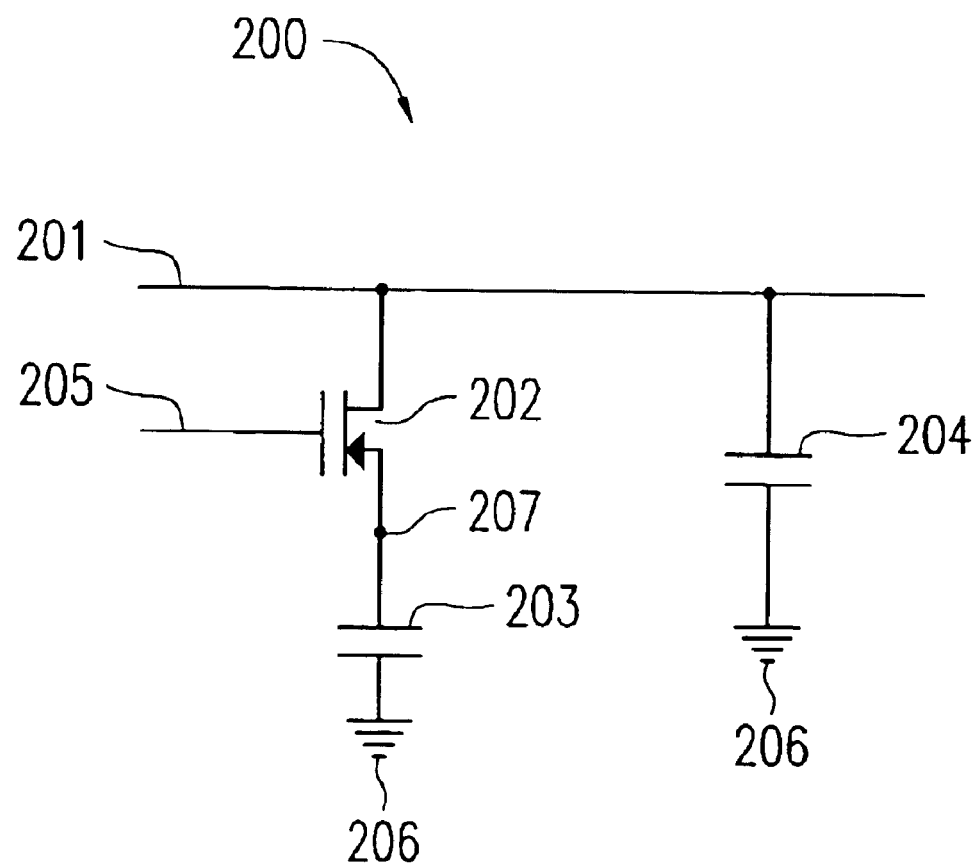
FIG. 2 is a circuit diagram of a binary CAM cell.
Figure 3:
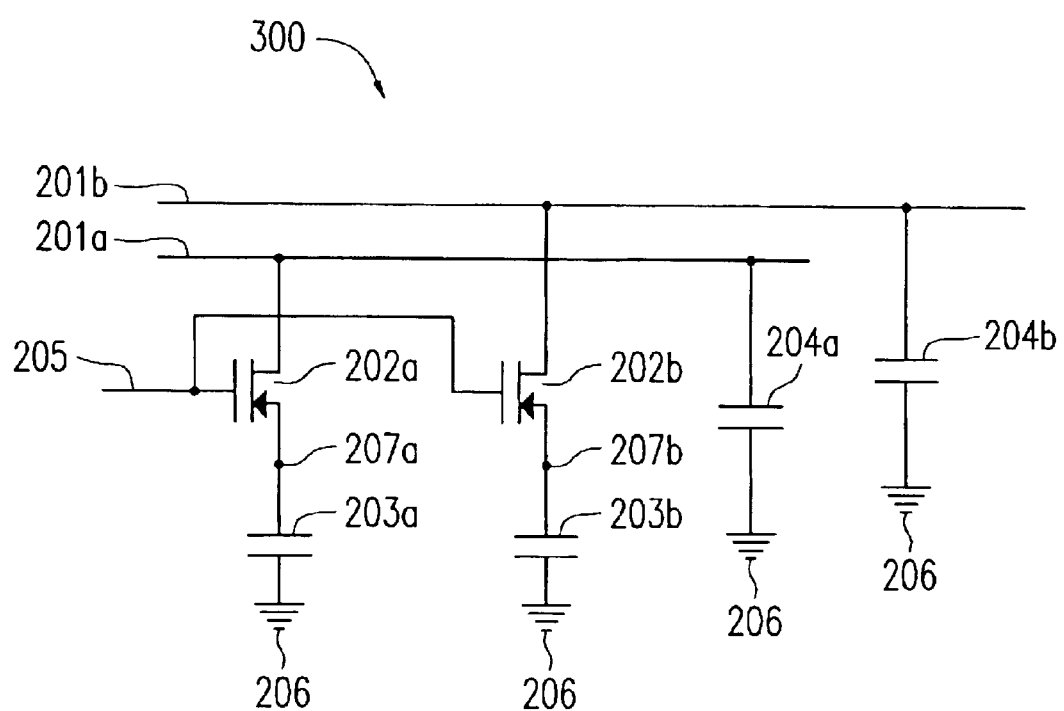
FIG. 3 is a circuit diagram of a ternary CAM cell based on the binary CAM cell of FIG. 2.
Figure 4:
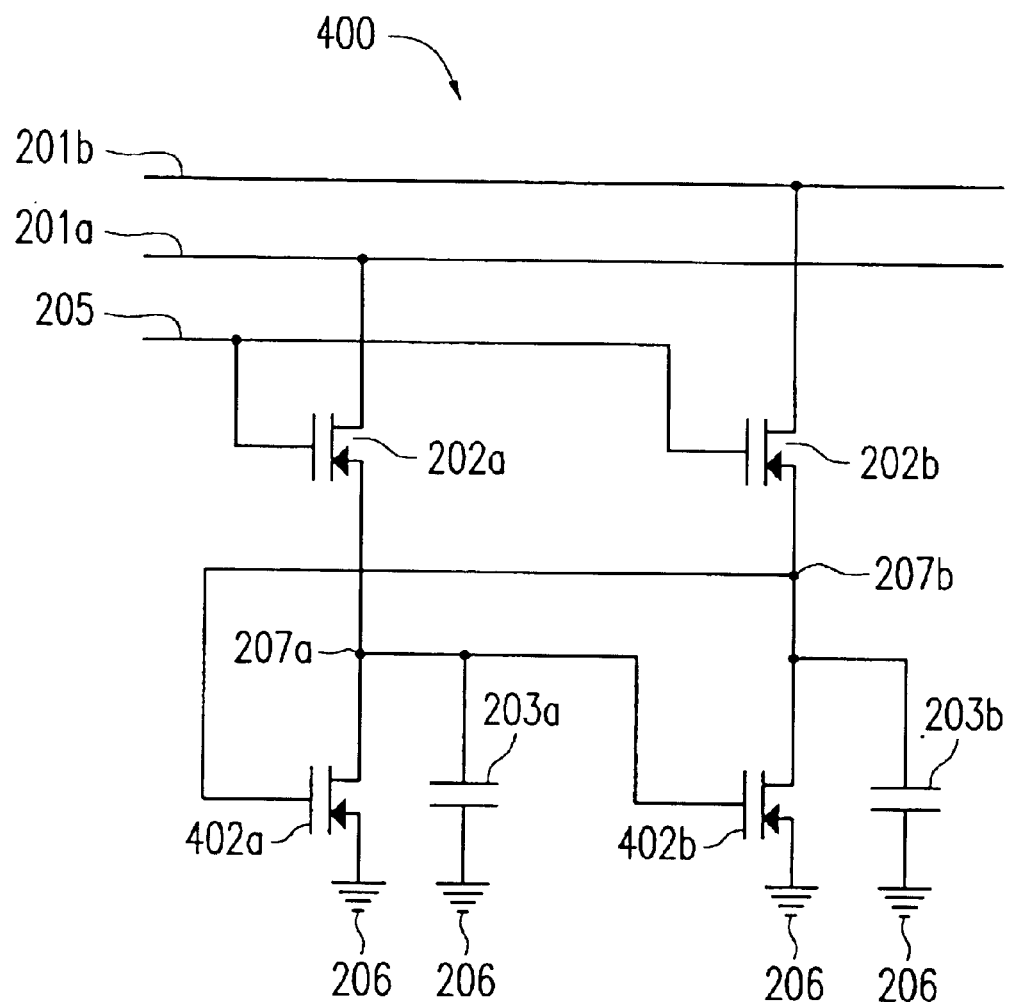
FIG. 4 is a circuit diagram of a CAM cell having two bits of storage and which may be used as a binary CAM cell which can be read nondestructively.
Figure 5:
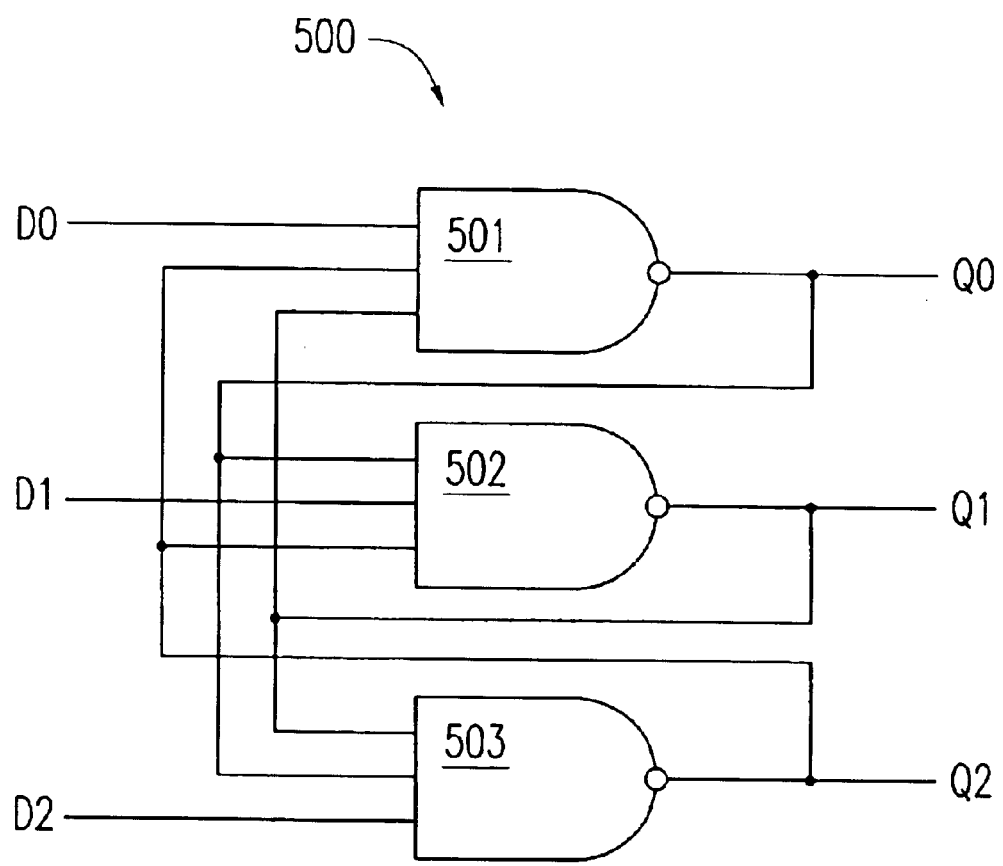
FIG. 5 is a circuit diagram of tertiary storage element.
Figure 6:
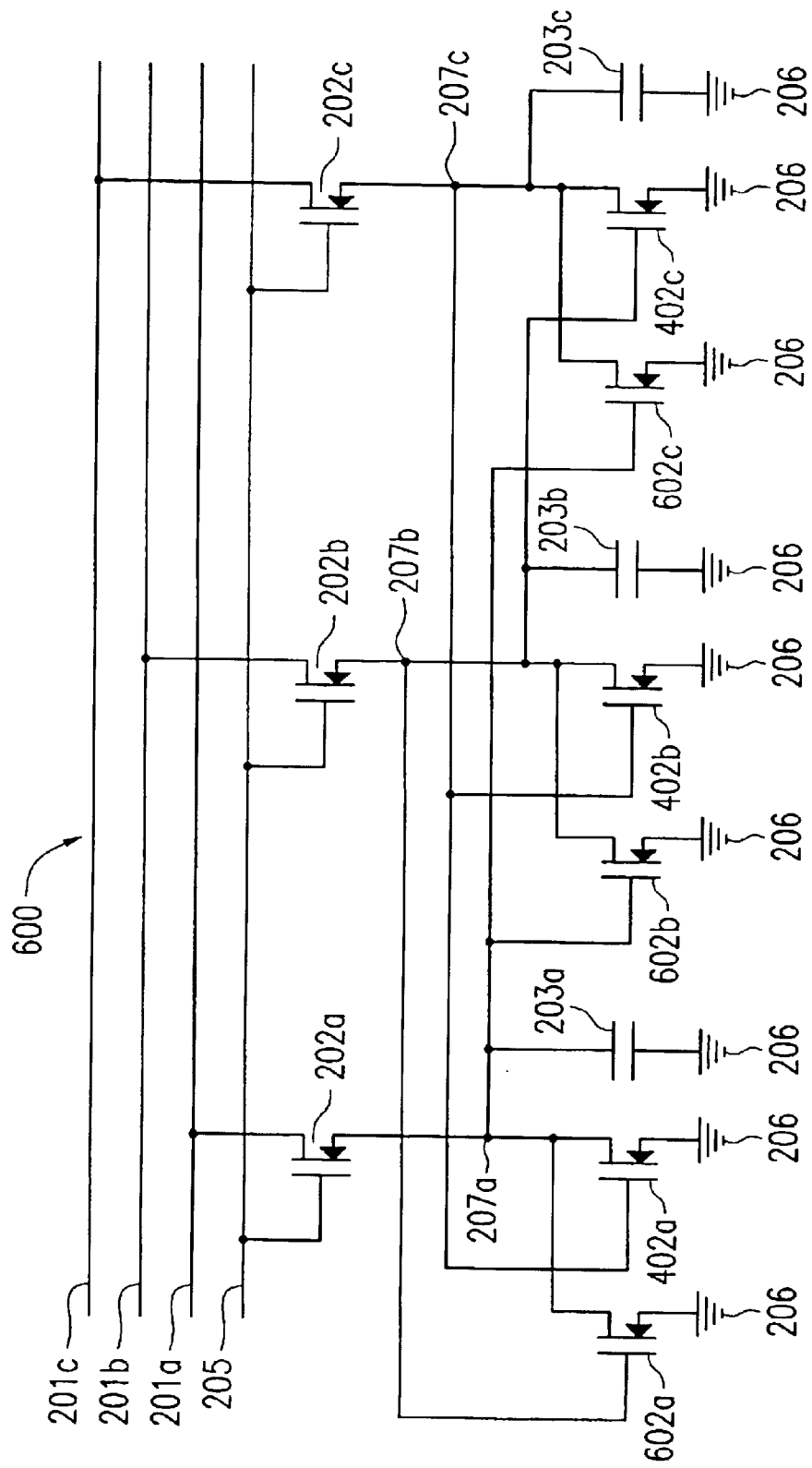
FIG. 6 is a circuit diagram of a ternary CAM cell having three bits of storage per cell.

The CAM cell architecture of the present invention is illustrated as CAM cell 600 in FIG. 6 and utilizes a tertiary storage element having particular properties in order to support reading without requiring a charge restoration operation. However, before discussing in detail the structure and operation of the CAM cell architecture of the present invention, it may be useful to examine the operation of the tertiary storage circuit 500 of FIG. 5, as there are numerous similarities between circuit 500 and cell 600.

The tertiary storage circuit 500 (FIG. 5) comprises three NAND gates 501, 502, 503 which couple three inputs D0, D1, D2 to three outputs Q0, Q1, Q2, respectively. The output of each NAND gate 501, 502, 503 is also coupled as an input to the other NAND gates. For example, NAND gate 501 has an output Q0 which is provided as an input to NAND gates 502, 503. The use of feedback in this manner limits the number of stable input/output states for the circuit 500. In particular, the circuit 500 supports thee stable states wherein only one of the three inputs D0, D1, D2 of the circuit 500 is at a logical "1" (with the remaining inputs each at a logical "0") and wherein only one of the three outputs Q0, Q1, Q2 is at a logical "0" (with the remaining outputs each at a logical "1"). These three stables states are illustrated in the following truth table.

| Input | | | Output | | |
|---|---|---|---|---|---|
| D0 | D1 | D2 | Q1 | Q2 | Q3 |
| 1 | 0 | 0 | 0 | 1 | 1 |
| 0 | 1 | 0 | 1 | 0 | 1 |
| 0 | 0 | 1 | 1 | 1 | 0 |

One important aspect of the above truth table is that when one of the outputs (e.g., Q1) is at a logical "0" state, due to the way the NAND gates 501, 502, 503 are coupled, the remaining outputs (e.g., Q2, Q3) are forced to take the logical "1" state.

The CAM cell 600 (FIG. 6) of the present invention is based upon the stable state properties of the above described circuit. The CAM cell 600 is a dynamic CAM cell and includes three storage elements in the form of capacitors 203a, 203b, 203c. Each capacitor is associated with a respective bit line 201a, 201b, 201c. Access between the bit lines 201a, 201b, 201c and the capacitors 203a, 203b, 203c is governed by transistors 202a, 202b, 202c, each of which has its gate coupled to line 205.

The capacitors 203a 203b 203c are each associated with two of discharge devices. In one illustrated embodiment, the discharge devices are transistors. For example, capacitors 203a, 203b, 203c are respectively coupled in parallel to a first set of transistors 402a, 402b, and 402c. Transistors 402a, 402b have their gates coupled to node 207c. Transistor 402c has its gate coupled to node 207b. The capacitors 203a, 203b, 203c are also respectively coupled in parallel to transistors 602a, 602b, 602c. The gate of transistor 602a is coupled to node 207b. Transistors 602b, 602c have their gates coupled together and to node 207a.

The above described circuit topology is designed using a principle similar to the tertiary storage circuit 500 (FIG. 5) because the above described circuit topology supports three stable states wherein only one of the three capacitors 203a, 203b, 203c stores a high level of charge (e.g., a logical "1") while the other two capacitors are discharged (e.g., a logical "0"). In particular, the nodes 207a, 207b, 207c are respectively associated with capacitors 203a, 203b, 203c and function much like the feedback feature of circuit 500. This is because the charge level of one capacitor is coupled via one of the nodes to control the discharge devices (e.g., 602b, 602c) coupled to the other capacitors. For example, if capacitor 203a stores a high charge, node 207a would be at a high potential. Node 207a is coupled to the gate of transistor 602b and the gate of transistor 602c, thus both transistors 602b, 602c will be switched on. When transistor 602b is switched on, charge will flow from capacitor 203b to ground 206 via transistor 602b. Similarly, when transistor 602c is turned on, capacitor 203c will discharge to ground 206 via transistor 602c.

The cell 600 can be written by setting one of the bit lines 201a, 201b, 201c to a high logic level (e.g., a logical "1") and the remaining two bit lines 201a, 201b, 201c to a low logical level (e.g., a logical "0"). Once the bit lines 201a, 201b, 201c have been set to the appropriate voltage levels, a logical high signal is placed on line 205, causing the gates of transistors 202a, 202b, 202c to conduct, thereby transferring charge corresponding to a high logical level to one of the capacitors 203a, 203b, 203c associated with the bit line 201a, 201b, 201c set to a high logic level and transferring charge corresponding to a log logical level to two of the capacitors 203a, 203b, 203c associated with the bit lines 201a, 201b, 201c set to a low logic level.

The cell 600 can be read by precharging the bit lines 201a, 201b, 201c to high, switching on the access transistors 202a, 202b, 202c, and observing potential changes on the bit lines 201a–201c. As previously noted, when a capacitor stores a high level of charge, the read process does not reduce the charge level of the capacitors. Thus, a capacitor at a high logical state will retain that logical state through a read. In cell 600, when a capacitor is at a low logical state, it will retain that logical state through a read as well because one of the other capacitors will be at a high logical state, ensuring that one of the transistors coupled in parallel to a capacitor having low logical state will discharge to ground. The cell 600 can therefore be used as a building block for CAM arrays which do not require a charge restoration procedure following each read operation.

Thus, the present invention is directed to a tertiary CAM cell 600. The CAM cell 600 (FIG. 6) includes three bits of storage, arranged in a nine transistor architecture. The architecture includes three stables states where only one of the three bits is at a logical "0" while the other two bits are at a logical "1." These three stables states are sufficient to encode the logical "0", "1", and "don't care" states required in a ternary CAM. The three stable states can also be read without requiring a charge restoration procedure while maintaining the integrity of the storage.

Figure 7:
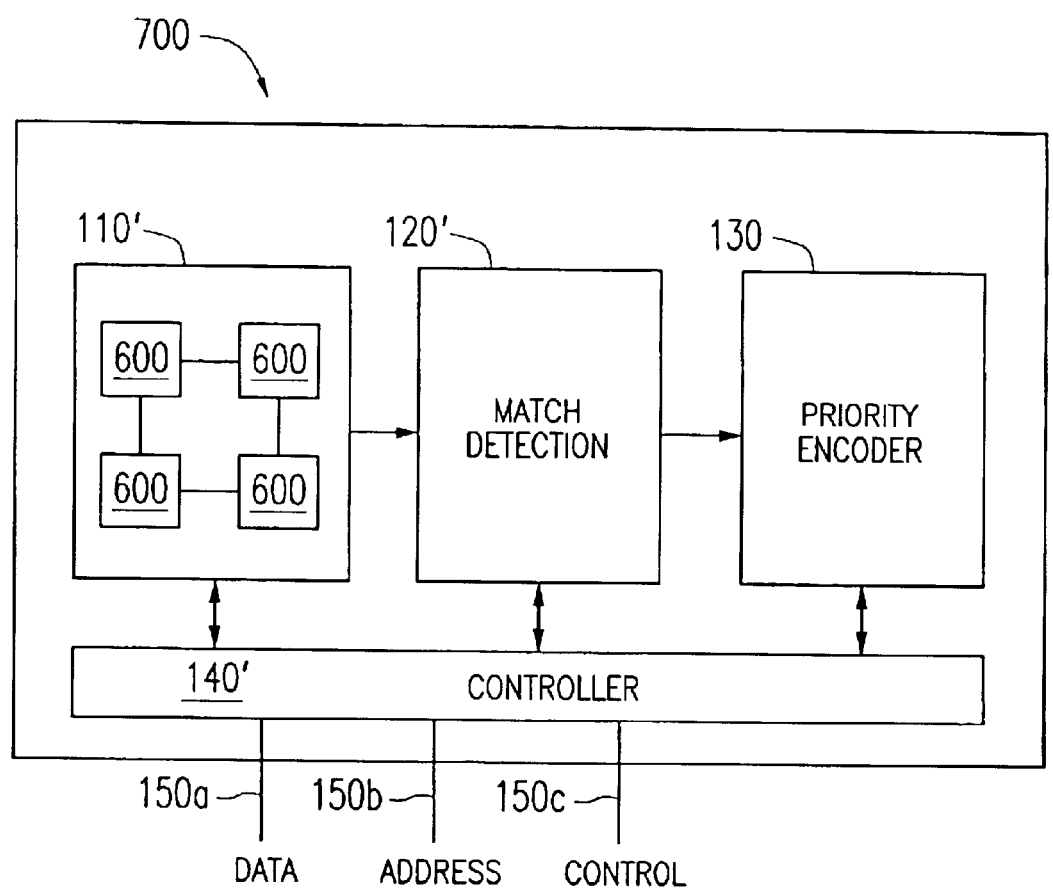
FIG. 7 is a block diagram of CAM device using an array of ternary CAM cells as illustrated in FIG. 6.

FIG. 7 is an illustration of a CAM device 700 utilizing an array 110' of the CAM cells 600 of the present invention. A match detection circuit 120' is coupled to the array 110. The CAM device 700 may also optionally include a priority encoder 130 coupled to the match detection circuitry 120. A control circuit 140' is coupled to the array 110', match detection circuit 120, priority encoder 130, and the data 150a, address 150b, and control 150c signal lines. The control circuit 140' and match detection circuit 120' are similar to their conventional counter parts, but have been adapted to work with an encoding which maps the three stable states (i.e., 100, 010, 001) of the CAM cells to the "0", "1", and "don't care" states of a ternary CAM. For example, state 100 may correspond to a logical "0", while state 010 may correspond to a logical "1", and state "001" may correspond to a "don't care" state. The priority encoder 130 may be coupled to the match detection circuit to prioritize the output of the CAM device 700 should multiple entries in the device 700 match a data sample.

Figure 8:
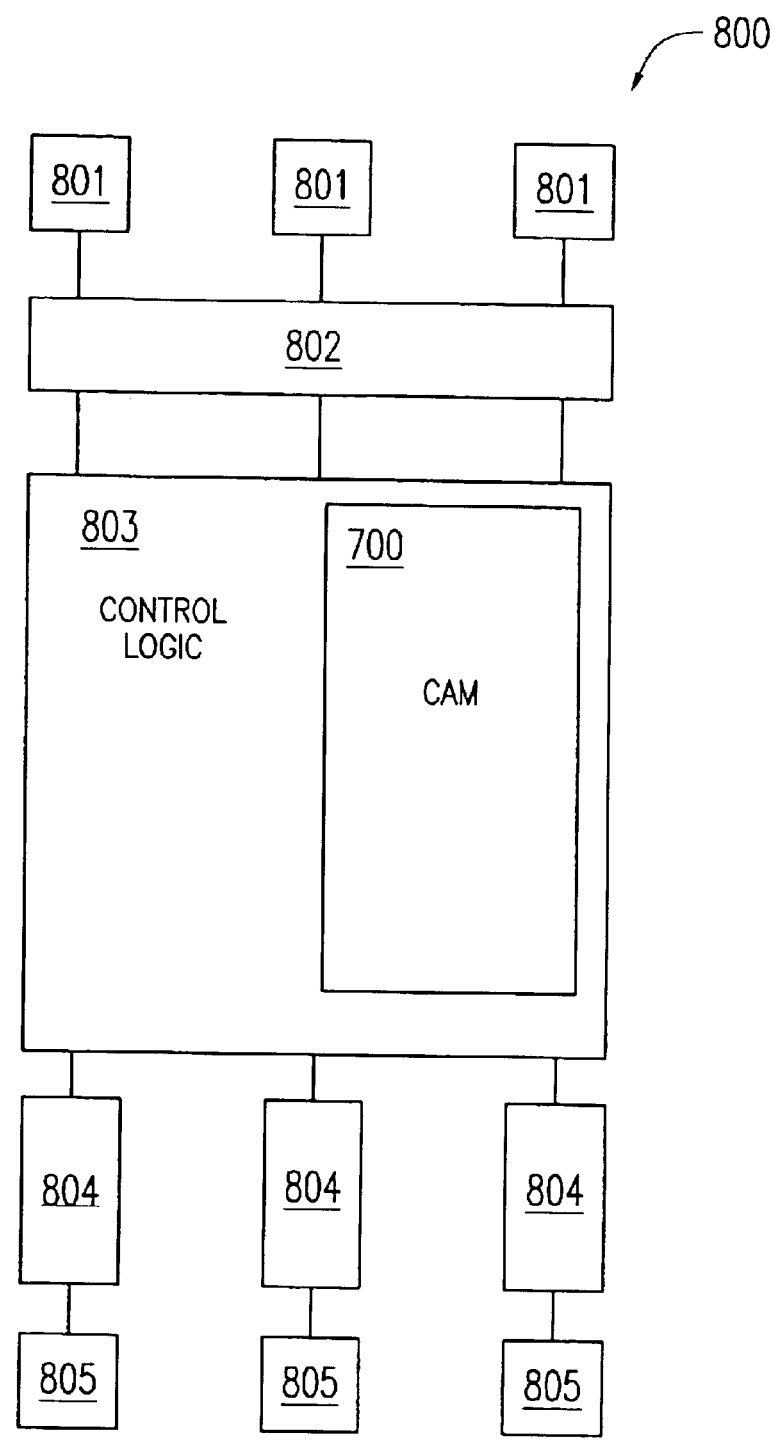
FIG. 8 is a block diagram of a network device employing a CAM device as illustrated in FIG. 7.

FIG. 8 is an illustration of how the CAM device 700 can be used in a network device 800. The network device 800 might be, for example, a network router 800 which examines each data packet received from input ports 801 and routes each packet to one of a plurality of output ports 805. As data packets are received from each input port 801, they are temporarily stored in an input buffer 802. The input buffer 802 may be organized as a queue and read by a control logic 803. Each packet includes an address field. Generally, a portion of the address field specifies a network or sub-network address, while another portion of the address field specifies a node on a network/sub-network. The control logic 803 examines the data packet at the head of the queue 802 and determines which one of the plurality of output ports (each corresponding to, for example, a different network or sub-network) will receive the data packet. The control logic 803 may also store each newly resolved network/sub-network address-to-output port pairing in the CAM device 700. When a new packet is examined by the control logic 703, the network or sub-network address from the data packet is extracted and searched by the CAM device 700 for a previously resolved route. In the case of a match, the data packet can be quickly transferred to the correct output port without additional processing.

While the invention has been described in detail in connection with the exemplary embodiment, it should be understood that the invention is not limited to the above disclosed embodiment. Rather, the invention can be modified to incorporate any number of variations, alternations, substitutions, or equivalent arrangements not heretofore described, but which are commensurate with the spirit and scope of the invention. Accordingly, the invention is not limited by the foregoing description or drawings, but is only limited by the scope of the appended claims.

What is claimed as new and desired to be protected by Letters Patent of the United States is:

1. A method for operating a tertiary content addressable memory (CAM) cell, comprising:

setting a first of three binary storage elements to a first binary state to indicate a first tertiary state of said CAM cell, wherein in response to said first binary storage element being set to a first binary state, said second and third binary storage elements are each set to a second binary state.

2. The method of claim 1, further comprising, setting the second of three binary storage elements to a first binary state to indicate a second tertiary state of said CAM cell, wherein in response to said second binary storage element being set to a first binary state, said first and third binary storage elements are each set to a second binary state.

3. The method of claim 2, further comprising, setting the third of three binary storage elements to a first binary state to indicate a third tertiary state of said CAM cell, wherein in response to said third binary storage element being set to a first binary state, said first and second binary storage elements are each set to a second binary state.

4. The method of claim 3, wherein said first, second, and third tertiary states are members of a set consisting of the following elements, a binary "0";

a binary "1"; and a "don't care" state.

5. The method of claim 1, further comprising:

reading the state of said first binary storage element, said reading further comprising the steps of, precharging a first bit line controllably coupled to said first storage element to a predetermined level;

coupling said first bit line to said first binary storage element; and coupling, sensing a change in potential of said first bit line;

wherein said reading does not change the state of said first storage element.

6. The method of claim 2, further comprising:

reading the state of said second binary storage element, said reading further comprising the steps of, precharging a second bit line controllably coupled to said second storage element to a predetermined level;

coupling said second bit line to said second binary storage element; and sensing a change in potential of said second bit line;

wherein said reading does not change the state of said second storage element.

7. The method of claim 3, further comprising:

reading the state of said third binary storage element, said reading further comprising the steps of, precharging a third bit line controllably coupled to said third storage element to a predetermined level;

coupling said third bit line to said third binary storage element; and after said coupling, sensing a change in potential of said third bit line;

wherein said reading does not change the state of said third storage element.

* * * * *